US 6,608,379 B2

(12) United States Patent
Yeo et al.

(10) Patent No.: US 6,608,379 B2
(45) Date of Patent: Aug. 19, 2003

(54) ENHANCED CHIP SCALE PACKAGE FOR FLIP CHIPS

(75) Inventors: Yong Kee Yeo, Singapore (SG); Damaruganath Pinjala, Singapore (SG); Mahadevan K. Iyer, Singapore (SG)

(73) Assignee: Institute of Microelectronics, et al.

( * ) Notice: Subject to any disclaimer, the term of this patent is extended or adjusted under 35 U.S.C. 154(b) by 0 days.

(21) Appl. No.: 10/078,719

(22) Filed: Feb. 19, 2002

(65) Prior Publication Data

US 2003/0132529 A1 Jul. 17, 2003

(30) Foreign Application Priority Data

Nov. 2, 2001 (SG) .................................... 2001-06785-9

(51) Int. Cl.[7] .............................................. H01L 23/34
(52) U.S. Cl. ..................... 257/706; 257/713; 257/717; 257/720; 257/738; 257/778; 257/786; 228/180.22; 438/122
(58) Field of Search ................................ 257/706, 712, 257/713, 717, 720, 737, 738, 778, 779, 780, 782, 786; 438/106, 108, 109, 122; 228/180.21, 180.22

(56) References Cited

U.S. PATENT DOCUMENTS

| 5,113,315 A | * | 5/1992 | Capp et al. ................ 361/704 |
| 5,741,729 A | * | 4/1998 | Selna ......................... 438/125 |
| 5,851,337 A | * | 12/1998 | Chen ......................... 156/275.3 |
| 5,898,217 A | * | 4/1999 | Johnston .................... 257/691 |
| 5,933,324 A | * | 8/1999 | Barrett ....................... 361/703 |
| 5,959,356 A | * | 9/1999 | Oh .............................. 257/738 |
| 6,198,635 B1 | * | 3/2001 | Shenoy et al. ............. 361/760 |
| 6,362,525 B1 | * | 3/2002 | Rahim ........................ 257/738 |
| 6,479,758 B1 | * | 11/2002 | Arima et al. ............... 174/260 |
| 6,525,942 B2 | * | 2/2003 | Huang et al. .............. 361/704 |
| 2002/0139571 A1 | * | 10/2002 | Mizunashi .................. 174/255 |

FOREIGN PATENT DOCUMENTS

| EP | 877419 A2 | * | 11/1998 | .......... H01L/21/60 |
| JP | 02254747 A | * | 10/1990 | .......... H01L/23/52 |
| JP | 03259543 A | * | 11/1991 | .......... H01L/21/60 |
| JP | 11074407 A | * | 3/1999 | .......... H01L/23/12 |
| JP | 2001284488 A | * | 10/2001 | .......... H01L/23/12 |

* cited by examiner

Primary Examiner—David L. Talbott
Assistant Examiner—Alonzo Chambliss
(74) Attorney, Agent, or Firm—Coats & Bennett, P.L.L.C.

(57) ABSTRACT

A chip scale package (CSP) comprises a flip chip and chip carrier with features to enhance its electrical and thermal performance. The flip chip connects to the chip carrier through alternating signal and ground connections. Top layer routing on the chip carrier substantially maintains ground-based guard isolation between neighboring signal lines. The arrangement of inter-layer vias and bottom layer traces also maintains the isolation for flip chip signals routed to the bottom layer of the chip carrier, where they are available for interconnection with a primary circuit board via solder balls or the like. The bottom layer further includes a centralized ground plane. Special thermal vias extend from the top layer into this bottom layer ground plane. Dedicated solder ball connections for the ground plane provide a ground path between the flip chip and the primary circuit with very low electrical and thermal impedances.

30 Claims, 9 Drawing Sheets

US 6,608,379 B2

ENHANCED CHIP SCALE PACKAGE FOR FLIP CHIPS

BACKGROUND OF THE INVENTION

The present invention generally relates to integrated circuits, and particularly relates to chip scale packaging of flip chip integrated circuits.

Packaging technology represents an enabling element in the ongoing microelectronics revolution. As integrated circuits have shrunk, so too have the physical packages carrying these devices. Various techniques are used to minimize the physical space required for integrated circuits, and to accommodate the increasingly high number of signal connections associated with dense integrated circuit devices.

Common approaches include various chip-on-glass and chip-on-board technologies. In these, an integrated circuit die is mounted directly on a primary circuit substrate, covered only by a minimal amount of epoxy or resin. While offering certain advantages in high-volume manufacturing environments, integrated circuit devices of this nature place significant challenges on handling and testing.

Other approaches strike a balance between physical size and the practical considerations of handling and testing. So-called "chip scale packages" (CSPs) attempt to provide physical packaging for integrated circuit die without increasing the total physical size substantially beyond that of the actual die. Ideally, such packages remain as small as possible while still providing relatively robust protection for the die itself.

Chip scale packaging techniques may incorporate flip chip technology. With flip chip technology, an integrated circuit die having connections on its top-side is literally flipped over and mounted upside down to provide more direct interconnection to various circuit elements within the die. In a CSP incorporating flip chip technology, an integrated circuit die is flipped over and mounted top-side down to a chip carrier.

The chip carrier functions much like a printed circuit board, providing a rigid platform that can be readily handled and easily mounted to a larger circuit board carrying other electrical or electronic circuits. Essentially, the chip carrier provides practical access to the electrical interconnections of the flip chip it carries.

Typically, the chip carrier comprises a substrate having a top layer providing a number of conductive pads matched to the electrical connections of the flip chip. The flip chip is physically and electrically bonded to this top layer. Signal traces from the top layer pads are typically routed down through the substrate to its bottom layer. The bottom layer provides a set of conductive pads corresponding to the signal connections of the flip chip mounted to the top-side of the substrate. Oftentimes, the bottom layer pads have an expanded spacing or "pitch" as compared to the top layer connections to facilitate design and manufacturing processes. Commonly, the bottom layer pads carry solder balls or the like, that allow the CSP to be soldered to a primary circuit board using any suitable technique, such as reflow soldering.

While CSPs incorporating flip chip technology provide opportunities for managing high I/O count devices while still maintaining a small overall size, they are not without potential disadvantages. For example, while the flip chip interconnection with the integrated circuit die helps minimize connection impedance, the overall connection impedance between signal points on the die and a primary circuit board on which the CSP is mounted may still be excessive. The small size of the CSP may also be a disadvantage in terms of its thermal performance. The relatively high thermal impedance of conventional CSPs can be particularly problematic in high-performance devices.

BRIEF SUMMARY OF THE INVENTION

The present invention provides a chip scale package adapted to carry a flip chip integrated circuit die, and incorporates certain features enhancing the electrical and thermal performance of the package. A flip chip integrated circuit die mounts to a corresponding set of connection pads on the top layer of a chip carrier. The top layer pads are arranged such that the signal and ground interconnections between the chip carrier and a flip chip itself are interleaved. This interleaving creates a signal-ground-signal transmission line structure adapted to carry high-frequency signals with minimal loss and interference. The alternating signal and ground connections are routed down from the top layer to a bottom layer of the chip carrier where they are terminated in solder ball connections suitable for mounting the chip carrier to a primary circuit board. Preserving the signal and ground interleaving on all signal layers of the chip carrier minimizes cross-signal coupling and signal path impedances.

The bottom layer of the chip carrier further comprises a centralized ground plane that includes a number of so-called "thermal" vias terminating in the top layer of the chip carrier. These thermal vias provide interconnection paths between the top layer and the bottom layer ground plane with low electrical and thermal impedances. The low thermal impedance of the thermal vias allows heat energy to flow from the flip chip device into the bottom layer ground plane. The bottom layer ground plane further comprises a number of solder balls for physically and electrically connecting the ground plane to the primary circuit board. These solder balls directly connect the ground plane to the primary circuit and thus complete the low electrical and thermal impedance paths from the top side of the carrier.

DETAILED DESCRIPTION OF THE INVENTION

Figure 1:
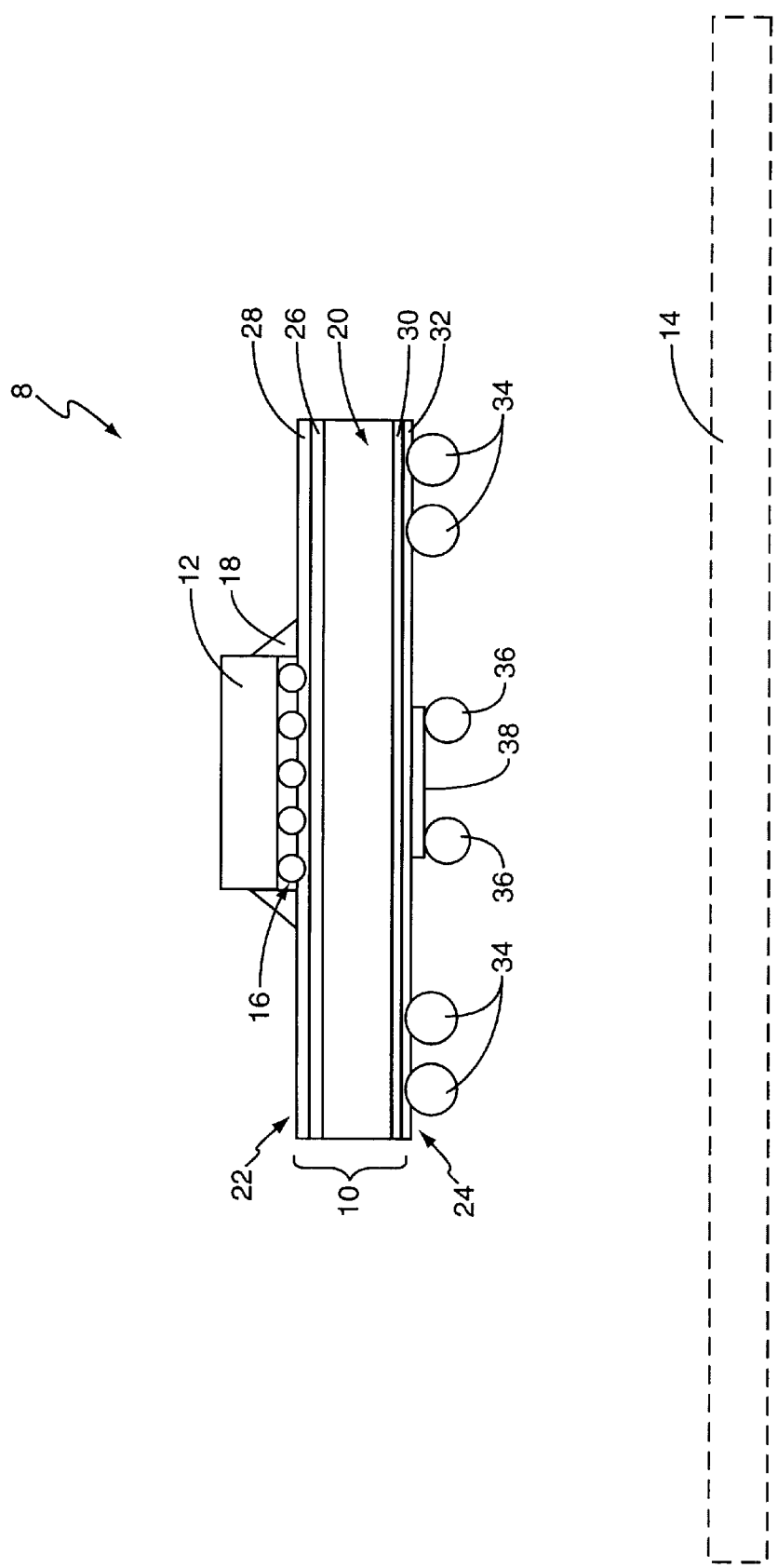
FIG. 1 is a diagram of a chip scale flip chip package assembly in accordance with present invention.

FIG. 1 illustrates a chip scale package assembly in accordance with the present invention that is generally referred to by the numeral 8. The assembly 8 comprises a chip carrier 10, and a flip chip integrated circuit die 12. In use, the assembly 8 is customarily attached or mounted to another circuit, usually larger circuit board, referred to herein as the primary circuit board 14.

The die 12 may be essentially any type of integrated circuit (IC), including digital, analog, or mixed-signal ICs. The die 12 includes a set of electrical connections on its top-side surface, which are generally implemented as a set of solder bumps 16. The solder bumps 16 provide contact points for making electrical interconnection between multiple signal and ground connections on the die 12 and the carrier 10. The die is referred to as a "flip chip" because it is flipped over, solder-bump side down for attachment to the chip carrier 10. In general, the set of solder bumps 16 form either a grid array or a perimeter array of contact points. For the purposes of this discussion, the solder bumps 16 are assumed to comprise a set of alternating signal and ground connections to the die 12 and are soldered to corresponding pads—discussed later—on the top side of the carrier 10. Often, an epoxy or resin under-fill 18 is used to seal the interface between the die 12 and the carrier 10.

The primary circuit 14 board is not part of the assembly 8, but is a common part of the environment in which the assembly 8 is used. Typically the primary circuit board 14 comprises a printed circuit board (PCB), sometimes referred to as a printed wiring board (PWB) that includes any number of integrated circuits, power supplies, connectors, and other types of electrical, or electro-mechanical devices. Generally, electrical interconnection between one or more of these other devices (not shown) and the die 12 is desired. Thus, the carrier 10 provides a mechanism for electrically and physically coupling the various signals of interest and ground connections on the die 12 with the primary circuit board 14. The carrier 10, as will be shown in more detail later, acts as a thermal conduit between the die 12 and the primary circuit board 14. The primary circuit board 14 itself acts as a heat sink to which the carrier 10 provides a low thermal impedance connection for the die 12.

The carrier 10 comprises a substrate 20, which may be a rigid, resin-based laminate, such as bismaleimide triazine (BT), or may be some other material with appropriate characteristics as needed or desired. The substrate 20 has a top side 22 and a bottom side 24. The top side 22 includes a signal layer 26 and a solder mask layer 28, while the bottom side 24 includes a signal layer 30 and a solder mask layer 32. As will be shown later, the top-side signal layer 26 includes a number of connection points (pads) for interconnecting to the solder bumps 16 on the die 12, while the bottom-side signal layer 30 includes a number of connection points (pads) for electrically coupling the die 12 to the appropriate connections on the primary circuit board 14. The solder masks 28 and 32 generally cover the top and bottom signal layers 26 and 30, respectively, while leaving certain electrical connections on these layers exposed as needed.

The physical and electrical connections between the carrier 10 and the primary circuit board 12 are completed using solder balls 34 corresponding to signal and ground connections and thermal solder balls 36. The thermal solder balls 36 provide low thermal impedance coupling between a bottom-side planar heat sink 38 of the carrier 10 and the primary circuit board 14.

The carrier 10 also includes characteristics contributing to electrical signal integrity between the die 12 and associated circuitry on the primary circuit board 14. This good signal integrity allows the flip chip die 12 to operate at signal frequencies up to and in excess of 6 GHz with 0.5 dB of insertion loss. Of course, thermal management becomes a significant concern for the die 12, particularly at GHz operating frequencies. The following discussion and accompanying diagrams highlight several features of the carrier 10 that contribute to its excellent electrical and thermal performance.

Figure 2:
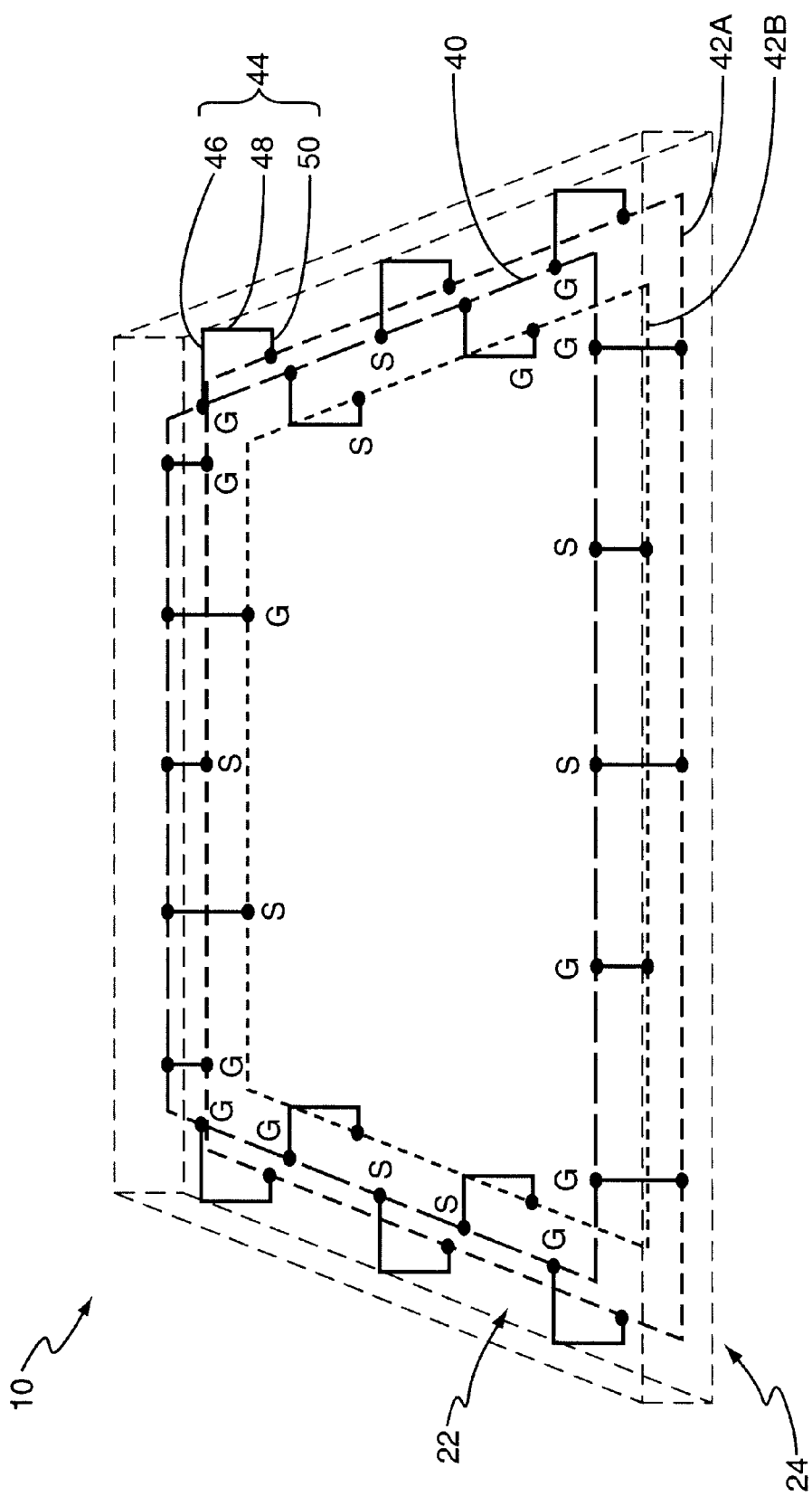
FIG. 2 is a simplified diagram of the alternating signal and ground transmission line structure of the package assembly of FIG. 1.

FIG. 2 is a simplified schematic representation of the carrier 10, and illustrates the electrical coupling it provides between the die 12 and the primary circuit board 14. The top side 22 of the carrier 10 includes a set of top-side pads 40. This set of top-side pads 40 provide electrical connections for the corresponding set of solder bumps 16 on the die 12. In this exemplary embodiment, the top-side pads 40 are disposed in the top-side signal layer 26, and arranged in an perimeter array of alternating signal and ground connections, in accordance with the signal and ground connections on the die 12. The bottom side 24 of the carrier 10 includes a set of bottom-side pads 42, arranged here as an outer array of bottom-side pads 42A and an inner array of bottom-side pads 42B.

Respective ones of the top-side pads 40 connect with respective ones of the bottom-side pads 42 through corresponding conductive paths 44. The solder balls 34 shown in FIG. 1 are individually attached to the bottom-side pads 42 for coupling to corresponding electrical connections on the primary circuit board 14. Thus, a top-side pad 40, along with corresponding conductive path 44, bottom-side pad 42, and solder ball 34, form an electrical connection between the die 12 and the primary circuit board 14. Each conductive path 44 typically includes a top-side conductive trace 46 disposed in the top-side signal layer 26 coupling its corresponding top-side pad 40 to a via 48, which provides an electrically conductive path through the substrate 20. A bottom-side conductive trace 50 typically disposed in the bottom-side signal layer 30 couples the via 48 to a corresponding one of the bottom-side pads 42.

In the exemplary arrangement, the outer and inner arrays of bottom-side pads 42A and 42B, respectively, form parallel rows of staggered pads 42 in an alternating signal and ground arrangement along each side of the carrier 10. The conductive paths 44 and their corresponding bottom side pads 42 preserve the alternating signal and ground connection arrangement established between the die's solder bumps 16 and the top-side pads 40. This arrangement interposes a ground-carrying conductive path 44 between signal-carrying paths 44. This alternating signal and ground connection arrangement between the die 12 and the primary circuit board 14 provided by the carrier 10 may be observed by noting the "S" and "G" designations in the illustration, corresponding to signal and ground connections, respectively.

In effect, the alternating signal and ground top-side and bottom-side pads 40 and 42, respectively, and the corresponding interconnecting conductive paths 44, provide a transmission line structure for electrical connections between the die 12 and the circuit board 14, which minimizes signal cross talk. Cross talk minimization contributes to the ability of the chip scale package assembly 8 of the present invention supporting operation of the flip chip die 12 at frequencies in excess of 6 GHz with 0.5 dB of insertion loss. Note that for the sake of simplicity, the diagram illustrates a limited number of top-side pads 40 and bottom-side pads 42. The extent to which alternating signal and ground connections may be established depends on the total number of pads 40 and 42, and the connection pattern illustrated is exemplary only.

Figure 3:
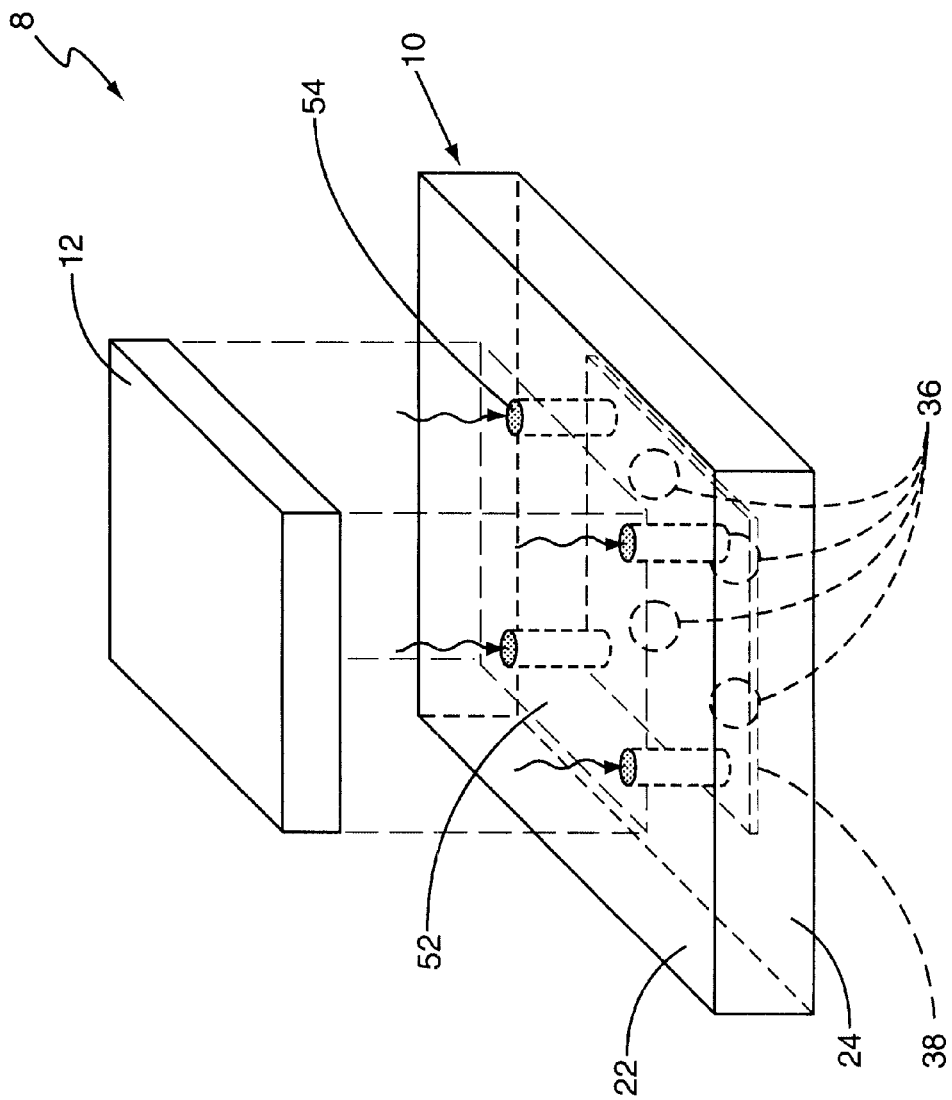
FIG. 3 is a simplified diagram of selected thermal management features of the package assembly of FIG. 1.

Other features contribute to the ability of the chip scale package assembly 8 to support operation at such high frequencies. FIG. 3 illustrates several of these additional features relating both to signal integrity and thermal management. The top side 22 of the carrier 10 includes a mounting area 52 for receiving the die 12. The perimeter of the mounting area 52 is generally defined by the array of top-side pads 40 (see FIG. 2). One or more thermal vias 54 are disposed within the mounting area 52 and connect with the bottom-side planar heat sink 38. In this exemplary embodiment, the bottom-side comprises a ground plane 38, which is typically implemented as a copper plane on the bottom side 24 of the carrier 10 that is connected to electrical ground, and which enhances thermal performance of the carrier 10.

Each thermal via 54 extends vertically down into the ground plane 38 on the bottom side 24 of the carrier 10. The thermal vias 54 act as low thermal impedance heat conduits, efficiently conducting heat generated by the die 12 down into the ground plane 38, which acts as a heat sink for the die 12. Because each thermal via 54 is electrically and thermally bonded to the ground plane 38, the thermal vias 54 also provide low electrical impedance ground paths for the flip chip die 12.

The ground plane 38 couples to the primary circuit board 14 using a number of so-called thermal solder balls 36 that are directly coupled to the ground plane 38. In manufacturing, the chip carrier 10 is soldered to the primary circuit board 14 using the thermal solder balls 36, as well as the signal- and ground-carrying solder balls 34 that are attached to the bottom-side pads 42A and 42B. By directly coupling the ground plane 38 to the primary circuit board 14 through the thermal solder balls 36, low electrical and thermal impedance paths are established between the die 12 and the primary circuit board 14. The primary circuit board 14 may include its own heat sinking features (not shown) such as copper planes to which the thermal solder balls 36 may be bonded.

Figure 4:
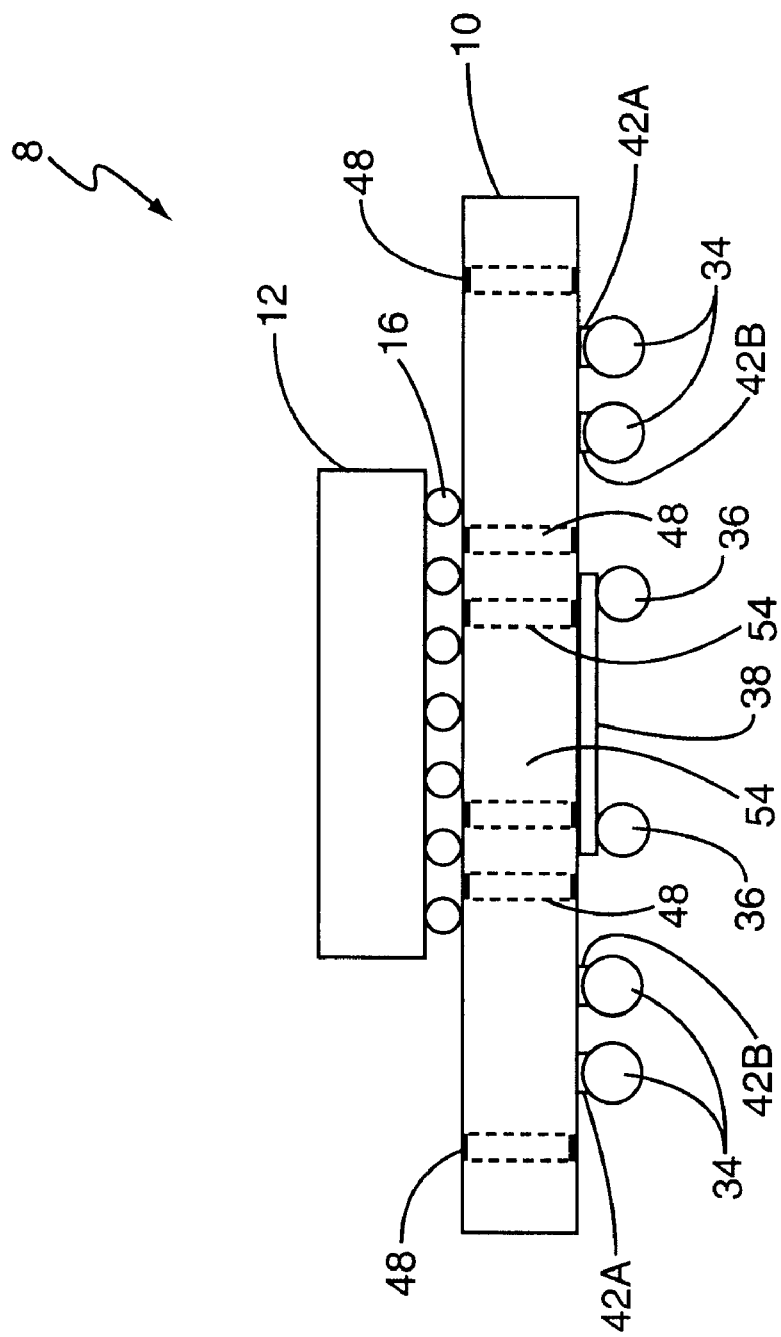
FIG. 4 is a more detailed side view of the chip carrier used in the chip package of FIG. 1.

FIG. 4 shows a simplified side view of the package assembly 8 that illustrates the signal and ground vias 48, as well as the thermal vias 54. Top-side pads 40 interconnect with corresponding ones in a set of signal- and ground-carrying vias 48 that form portions of the conductive paths 44 discussed earlier. These vias 48 are coupled to corresponding ones of inner and outer bottom-side pads 42A and 42B, respectively. The signal and ground connections from the bottom-side pads 42 are made with the primary circuit board using solder balls 34, with one solder ball 34 attached to each of the bottom-side pads 42. The thermal vias 54 positioned beneath the die 12 provide, as earlier noted, thermally conductive paths from the die 12 into the ground plane 38.

Figure 5:
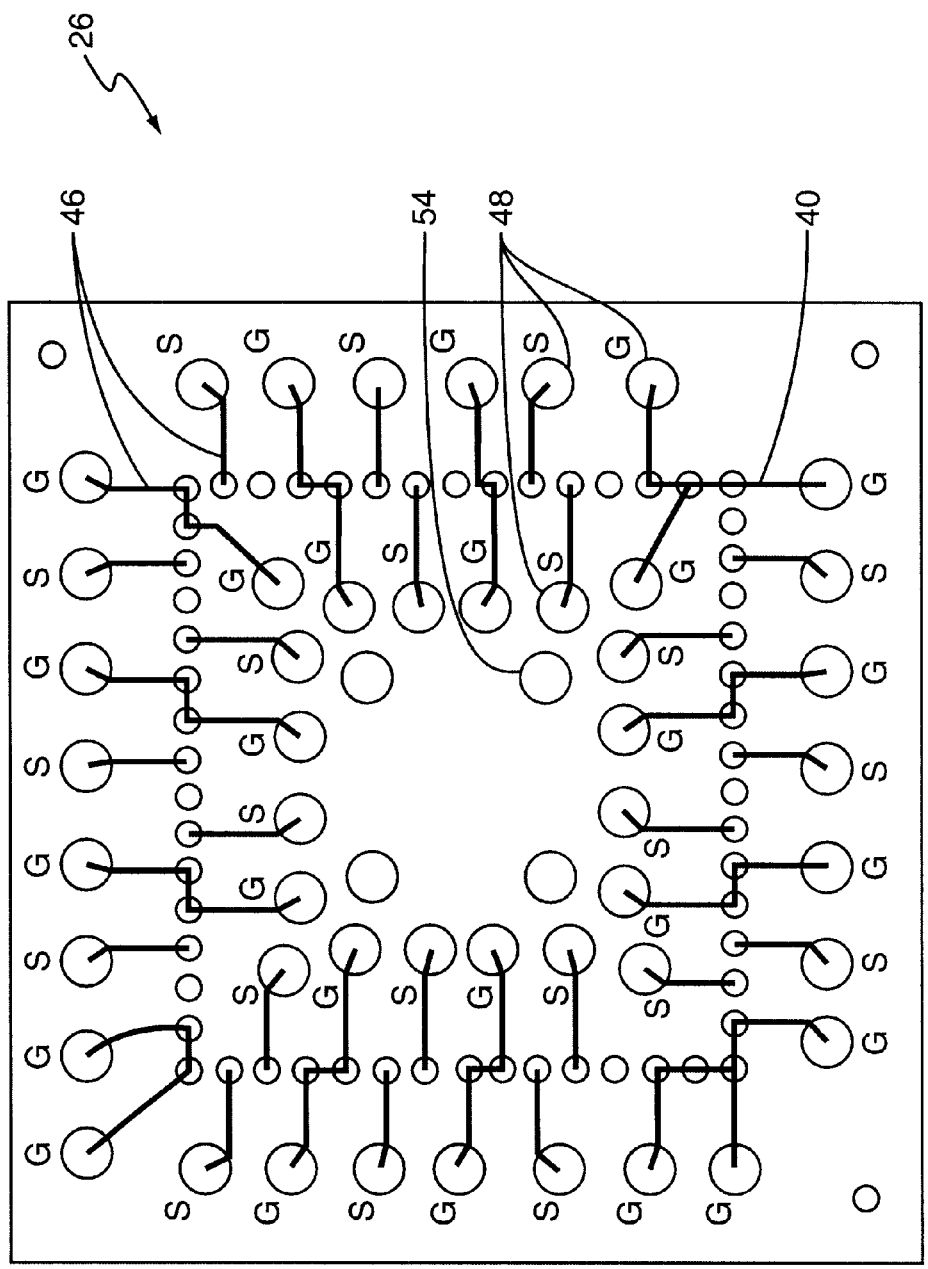
FIG. 5 is an exemplary top-side signal layer of the chip carrier.

FIG. 5 provides a more detailed view of the top-side signal layer 26 in an exemplary implementation of the carrier 10. The top-side pads 40 are electrically coupled to corresponding ones of the signal- and ground-carrying vias 48 by the top-side traces 46, which form portions of the conductive paths 44. FIG. 5 also shows the thermal vias 54 centrally positioned inside the inner ring of vias 48.

Figure 6:
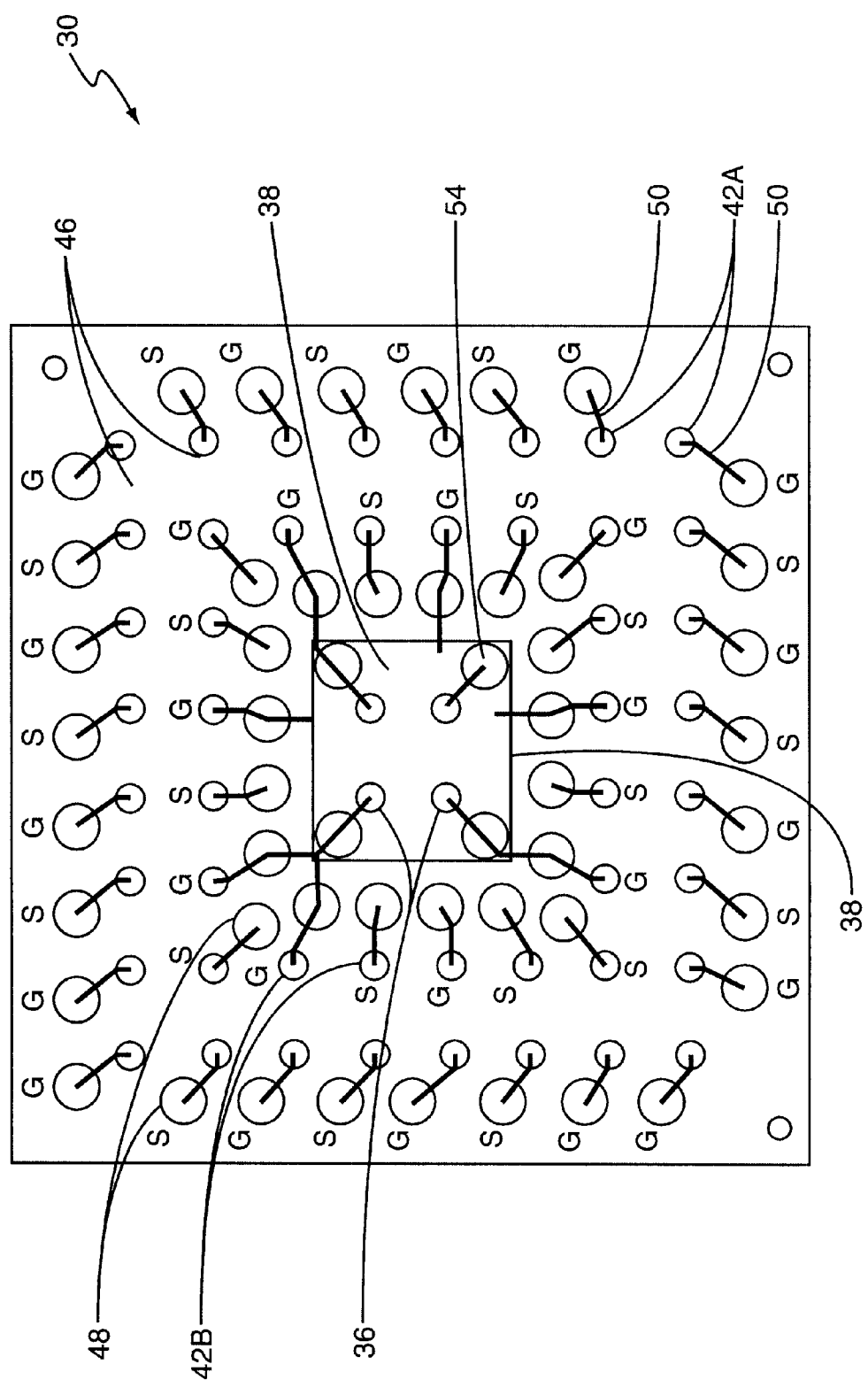
FIG. 6 is an exemplary bottom-side signal layer corresponding to the top-side signal layer FIG. 5

FIG. 6 illustrates the bottom-side signal layer 30 corresponding to the top-side layer 26 of FIG. 5, and depicts the outer and inner rectangular perimeters formed by the bottom-side pads 42A and 42B, respectively. Respective ones of the conductive traces 50 form portions of the conductive paths 44 and couple the bottom-side pads 42 to corresponding ones of the vias 48. Note that a portion of the vias 48 are arrayed about the perimeter formed by the outer array of bottom-side pads 42A, while a remaining portion of the vias 48 are arrayed about the inside of the perimeter formed by the inner array of bottom-side pads 42B. Also note that the alternating signal-ground-signal pattern is preserved between the top-side signal layer 26 and the bottom-side signal layer 30.

FIG. 6 further depicts the bottom-side ground plane 38, and shows the arrangement of the thermal vias 54 and thermal solder balls 36 relative to the ground plane 38. Note that a number of the ground-carrying bottom-side conductive traces 50 are connected to the ground plane 38. These connections further reduce the electrical impedance of the ground connections established between the die 12 and the primary circuit board 14.

Figure 7:
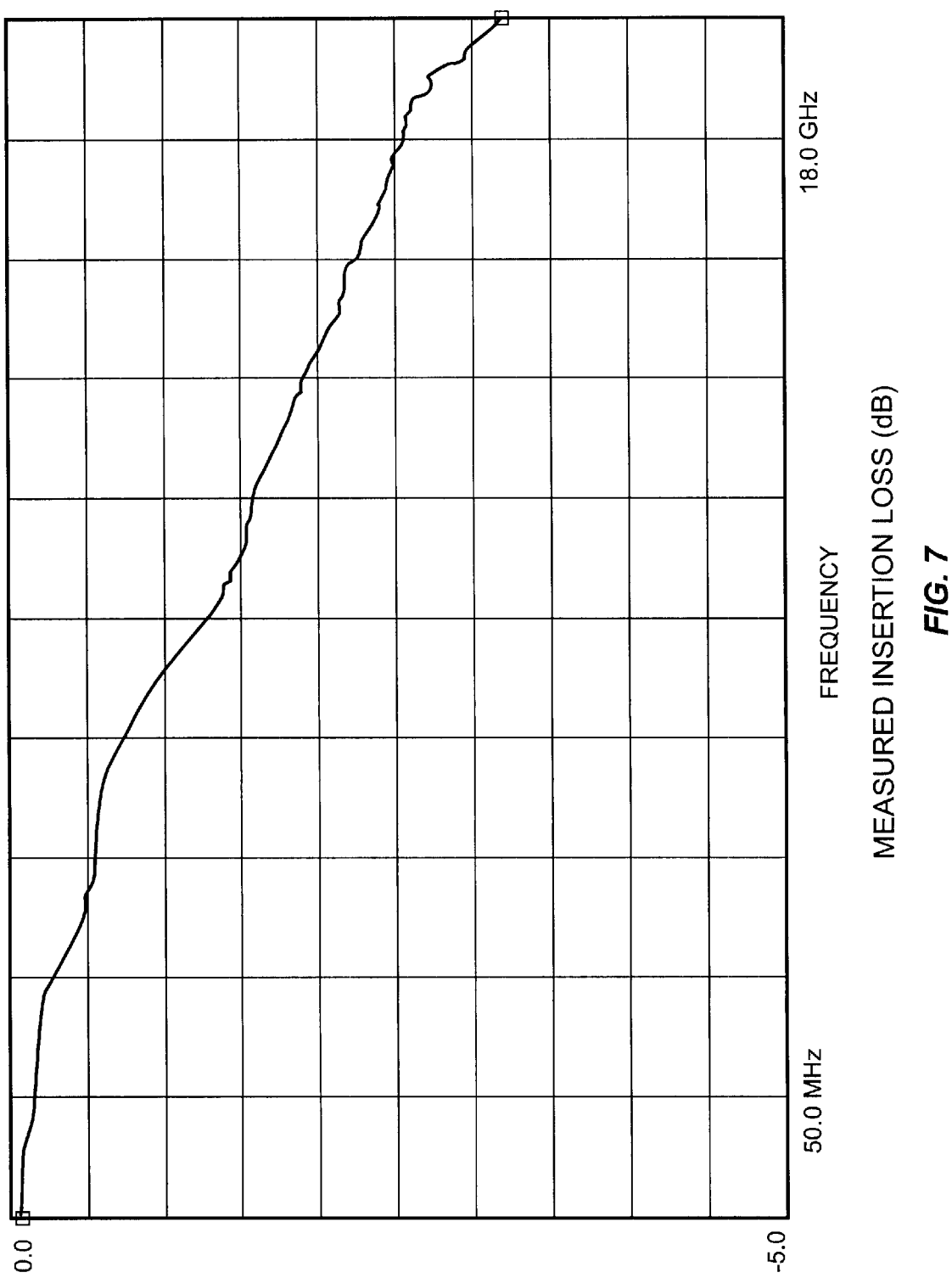
FIG. 7 is a graph of measured transmission loss for an exemplary embodiment of the package assembly of FIG. 1.

FIG. 7 illustrates measured insertion loss of the carrier 10. The diagram clearly shows that about 6 GHz and 17 GHz, the insertion loss is −0.5 dB and −3 dB, respectively. This performance enables use of the carrier 10 in high frequency flip chip applications ranging at least to 6 GHz, and also enables use in high-speed digital applications, such as those having clock speeds of about 2 to 3 GHz. The graph assumes a 5 mm×5 mm size for the carrier 10 using the top-side signal layer 26 and the bottom-side signal layer 30 arrangements shown in FIGS. 5 and 6, respectively. The horizontal axis plots frequency from 50 MHz to 18 GHz, while the vertical axis depicts transmission loss magnitude in dB. As shown, transmission loss through the carrier 10 between the die 12 in the primary circuit board 14 exhibits excellent transmission performance, with only 0.5 dB of insertion loss up to 6 GHz.

Figure 8:
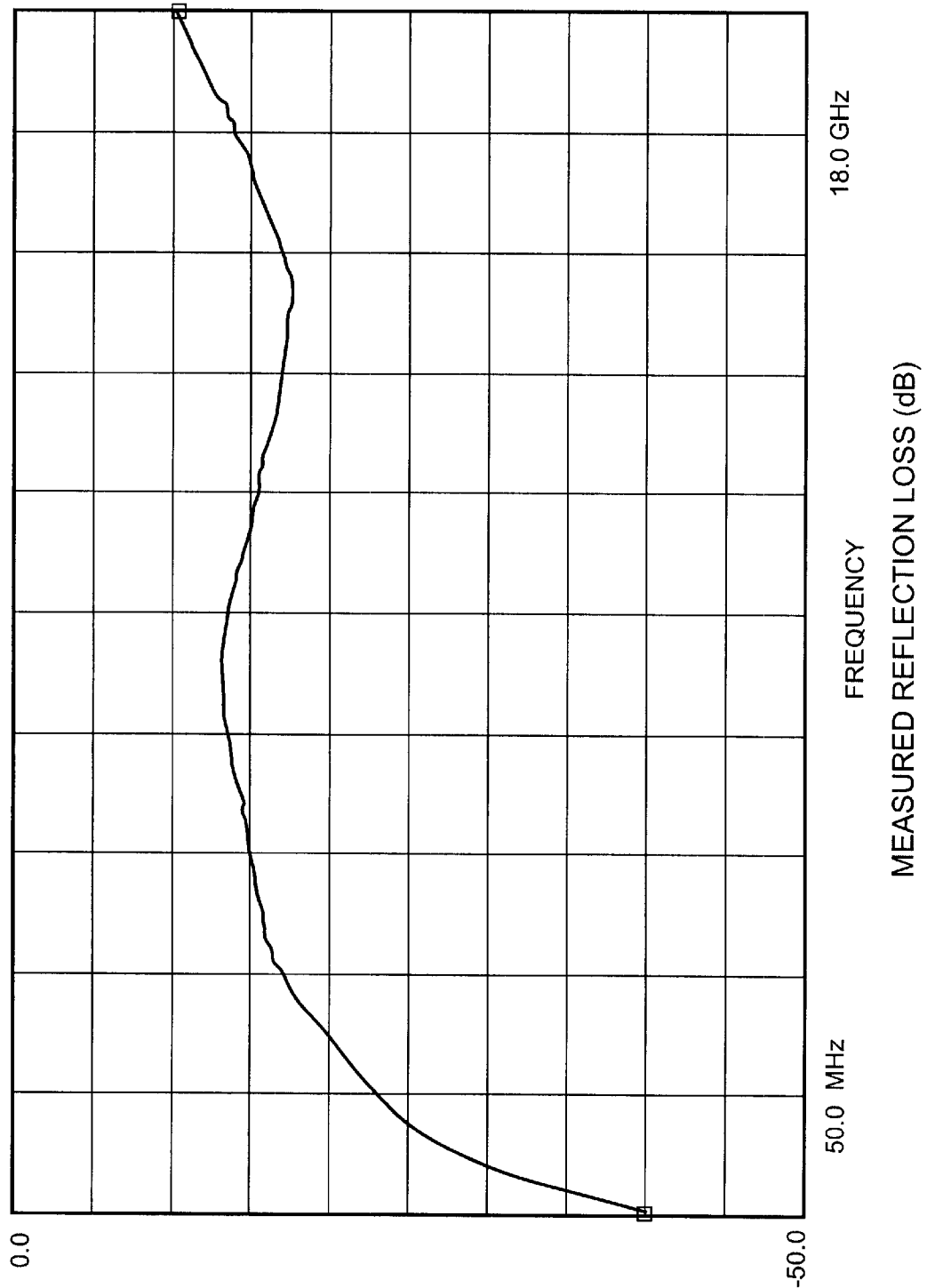
FIG. 8 is a graph of measured reflection loss for the exemplary embodiment of FIG. 7.

FIG. 8 depicts reflection loss for the package assembly 8 based on the same implementation details on which FIG. 7 is based. Again, the horizontal axis depicts frequency from 50 MHz to 18 GHz, while the vertical axis depicts reflection loss magnitude in dB.

Figure 9:
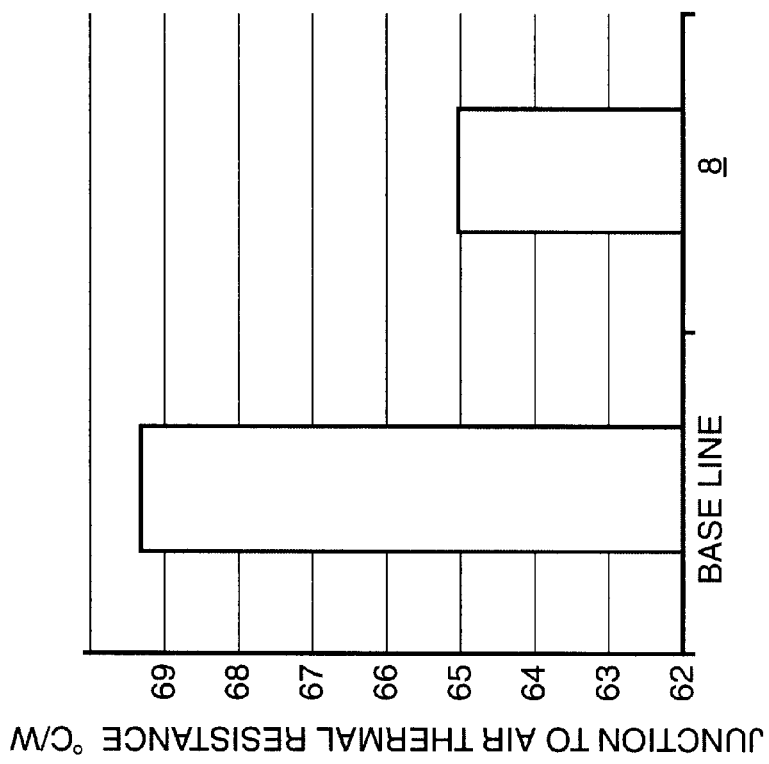
FIG. 9 is a graph of modeled thermal performance for the exemplary embodiment of FIG. 7.

While FIGS. 7 and 8 depict measured electrical performance of the package assembly 8, FIG. 9 illustrates modeled thermal performance of the chip scale package 8 of the present invention implemented in accordance with the details of FIGS. 5 and 6 compared with a similar package assembly that omits the ground plane 38, the thermal solder balls 36, and the thermal vias 54. The vertical axis depicts modeled junction to air thermal resistance for the die 12 in degrees centigrade per watt (° C./W). The thermal simulation model has been validated with measurements. Maximum power dissipation is predicted as 1.54 Watts using industry-standard measurement conditions and thermal window. As shown, the low impedance thermal paths established between the die 12 and the primary circuit board 14 in the package assembly 8 of the present invention provide substantial reduction in thermal resistance.

In exemplary embodiments, the present invention provides a chip scale package assembly 8 adapted to mount a flip chip die 12 to a primary circuit board 14, and to provide low electrical and thermal impedance connections between the die 12 and the board 14. The present invention is subject to variation in its implementation details and as such, the above discussion and accompanying drawings provide details for exemplary embodiments only, and should not be construed as limiting the invention. Indeed, the present invention is limited only by the following claims and the reasonable equivalents thereof.

What is claimed is:

1. A chip scale package for connecting a flip chip die having alternating signal and ground connections to a primary circuit board, said chip scale package comprising:

a substrate comprising a top side for mounting the flip chip die and a bottom side for mounting said substrate to the primary circuit board;

a set of top-side pads on said top side of said substrate, respective ones of said top-side pads corresponding to respective ones of the substantially alternating signal and ground connections of the flip chip die;

a set of bottom-side pads on said bottom side of said substrate for electrically connecting with the primary circuit board, respective ones in said set of bottom-side pads corresponding to respective ones in said set of top-side pads;

a plurality of conductive paths extending through said substrate from said top side to said bottom side and electrically coupling respective ones in said set of top-side pads to respective ones in said set of bottom-side pads, said conductive paths arranged to maintain alternating signal and ground connections between respective ones of said top-side pads and respective ones of said bottom-side pads a ground plane disposed on said bottom-side of said substrate within a central area of said bottom side of said substrate, said bottom side pads disposed generally about said ground plane; a plurality of thermal solder balls coupled to said ground plane to electrically and thermally couple said ground plane with the primary circuit board; a plurality of thermal vias projecting upward from said ground plane through said substrate to said top side of said substrate such that said plurality of thermal vias are beneath the flip chip die when the flip chip die is mounted to said top side; and conductive traces coupling selected ones of said conductive paths that are connected to electrical ground to said thermal vias.

2. The chip scale package of claim 1 wherein each one of said conductive paths comprises:

a via extending through said substrate from said top side to said bottom side;

a top-side trace coupling a corresponding one in said set of top-side pads to said via; and a bottom-side trace coupling a corresponding one in said set of bottom-side pads to said via.

3. The chip scale package of claim 1 wherein said set of bottom-side pads comprises an inner array of bottom side pads and an outer array of bottom side pads, both said inner and outer arrays of bottom-side pads arranged as alternating signal and ground connection pads.

4. The chip scale package of claim 3 wherein said conductive paths comprise alternating signal and ground transmission lines between respective ones in said top-side set of pads and respective ones in said inner and outer sets of bottom-side pads.

5. The chip scale package of claim 1 wherein said substrate further comprises a top-side signal layer on said top side of said substrate, said set of top-side pads disposed on said top-side signal layer, and a bottom-side signal layer on said bottom side of said substrate, said set of bottom-side pads disposed on said bottom-side signal layer.

6. The chip scale package of claim 1 further comprising the flip chip die bonded to said top-side of said substrate.

7. The chip scale package of claim 6 further comprising underfill material sealing a bottom edge of the flip chip die.

8. A chip scale package for connecting a flip chip die having signal and ground connections to a primary circuit board, said chip scale package comprising:

a substrate comprising a top side with a mounting area for receiving the flip chip die and a bottom side for connecting said substrate to the primary circuit board;

a first set of signal and ground pads on said top side of said substrate to electrically connect with the corresponding signal and ground connections on the flip chip die;

a second set of signal and ground pads on said bottom side of said substrate to electrically connect the flip chip die with the primary circuit board;

a plurality of signal and ground conductive paths extending from said top side to said bottom side of said substrate to electrically connect respective ones of said first set of signal and ground pads with respective ones of said second set of signal and ground pads, a ground plane on said bottom side of said substrate within a central area substantially beneath said mounting area of the flip chip die;

a plurality of grounded thermal vias extending upward through said substrate from said ground plane;

a plurality of conductive traces to connect selected ones of said ground conductive paths to respective ones of said grounded thermal vias to electrically connect said selected ones of said ground conductive paths to said ground plane; and a plurality of thermal solder balls coupled to said ground plane to provide electrically and thermally conductive paths from said ground plane to the primary circuit board.

9. The chip scale package of claim 8 further comprising a second plurality of solder balls, respective ones of said second plurality of solder balls coupled to respective ones of said second set of signal and ground pads.

10. The chip scale package of claim 8 wherein said first set of signal and ground pads comprise a top-side rectangular array of spaced apart signal and ground pads in an alternating signal and ground pattern.

11. The chip scale package of claim 10 wherein said plurality of signal and ground conductive paths comprise alternating signal and ground conductive paths corresponding to the alternating signal and ground pattern of said top-side rectangular array of spaced apart signal and ground pads.

12. The chip scale package of claim 11 wherein each said signal conductive path each said ground conductive path comprises:

a via extending through said substrate from said top side to said bottom side of said substrate;

a top-side conductive trace coupling a top end of said via to a respective one of said first set of signal and ground pads; and a bottom-side conductive trace coupling a bottom end of said via to a respective one of said second set of signal and ground pads.

13. A chip scale package to couple a flip chip die having a set of signal and ground connections with a primary circuit board, said chip scale package comprising:

a substrate comprising top and bottom sides, said top side of said substrate having a mounting area for receiving the flip chip die;

a first set of pads on said top side of said substrate arranged in an alternating pattern of signal and ground pads to electrically connect with the set of signal and ground pads on the flip chip die;

a second set of pads on said bottom side of said substrate corresponding to said first set of pads, said second set of pads arranged in an alternating pattern of signal and ground pads;

a plurality of conductive paths extending through said substrate and interconnecting corresponding ones of said first and second sets of pads in an alternating signal and ground pattern;

a ground plane on said bottom side of said substrate in an area of said bottom side substantially opposite said mounting area on said top side;

a plurality of thermal vias extending upward from said ground plane into said mounting area on said top side of said substrate to provide low thermal impedance paths between the flip chip die and said ground plane; and a plurality of thermal solder balls coupled to said ground plane to extend the low thermal impedance paths to the primary circuit board; and conductive traces coupling selected ones of said conductive paths to respective ones of said thermal vias to establish electrically conductive paths from the flip chip die to said ground plane.

14. The chip scale package of claim 13 wherein said second set of pads comprises:

an inner rectangular array of spaced apart signal and ground pads; and an outer rectangular array of spaced apart signal and ground pads.

15. The chip scale package of claim 14 wherein said first set of pads comprises a rectangular array of spaced apart signal and ground pads.

16. The chip scale package of claim 15 wherein said plurality of conductive paths comprise alternating connections between successive ones of said rectangular array of spaced apart signal and ground pads in said first set of pads and respective ones of said inner and outer rectangular arrays of spaced apart signal and ground pads in said second set of pads.

17. The chip scale package of claim 13 further comprising a plurality of solder balls coupled to respective ones in said second set of signal and ground pads to couple said second set of signal and ground pads to the primary circuit board.

18. The chip scale package of claim 13 further comprising:

a top-side solder mask formed on a portion of said top side of said substrate; and a bottom-side solder mask formed on a portion of said bottom side of said substrate.

19. The chip scale package of claim 13 further comprising the flip chip die mounted to said top side of said substrate.

20. The chip scale package of claim 19 further comprising an underfill epoxy sealing an interface between said flip chip die and said top side of said substrate.

21. The chip scale package of claim 13 wherein each said conductive path in said plurality of conductive paths comprises:

a via extending through said substrate from said top side to said bottom side;

a top-side conductive trace coupling one of said first set of signal and ground pads to said via; and a bottom-side conductive trace coupling the corresponding one of said second set of signal and ground pads to said via.

22. The chip scale package of claim 21 wherein said via comprises a plated-through-hole in said substrate.

23. A chip scale package for a flip chip die having a set of signal and ground connections, said chip scale package comprising comprising:

a substrate comprising top and bottom sides, said top side of said substrate comprising a mounting area to receive the die;

a first array of alternating ground and signal pads disposed on said top side of said substrate to electrically connect with corresponding ones in the set of signal and ground connections on the die;

a second array of alternating ground and signal pads disposed on said bottom side of said substrate corresponding to said first array, said pads in said second array adapted to carry solder balls for attaching said substrate to a primary circuit board;

a central ground plane disposed on said bottom side of said substrate and positioned substantially opposite said mounting area on said top side of said substrate;

a first plurality of vias for electrically connecting said pads on said top side with said pads on said bottom side, respective ones of said first and second arrays of pads coupled to said vias by conductive traces on said respective top and bottom sides of said substrate;

a second plurality of vias positioned within said mounting area on said top side of substrate, and extending from said top side into said central ground plane on said bottom side to provide thermal conduction paths between the die and said central ground plane, selected ones of said conductive traces extending to connect said second plurality of vias to electrical ground; and a plurality of thermal solder balls coupled to said central ground plan to provide thermal and electrical connections between said central ground plane and the primary circuit board.

24. The chip scale package of claim 23 wherein said conductive traces coupling respective ones of said first and second arrays of pads to said first plurality of vias comprise alternating signal and ground conductors arranged such that substantially all signal-carrying ones of said conductive traces are separated by intervening ground-carrying ones of said conductive traces.

25. The chip scale package of claim 23 wherein said central ground plane comprises a solid copper plane centrally positioned on said bottom side of said substrate.

26. The chip scale package of claim 23 wherein said thermal solder balls comprise solder balls directly coupled to said central ground plane.

27. The chip scale package of claim 23 wherein said first array of alternating ground and signal pads on said top side of said substrate comprises a peripheral array of interleaved ground and signal bump pads to mate with corresponding solder bumps on the die.

28. The chip scale package of claim 27 wherein said first plurality of vias comprise:

an outer set of vias arranged about an outer perimeter of said peripheral array of interleaved signal and ground bump pads; and an inner set of vias arranged about an inner perimeter of said peripheral array of interleaved signal and ground bump pads.

29. The chip scale package of claim 28 wherein said conductive traces comprise:

top-side conductive traces on said top side of said substrate to couple individual ones in said peripheral array of interleaved signal and ground bump pads to corresponding ones in said inner and outer sets of vias comprising said first plurality of vias; and bottom-side conductive traces on said bottom side of said substrate to couple individual ones in said second array of alternating ground and signal pads to corresponding ones in said inner and outer sets of vias comprising said first plurality of vias;

said top-side and bottom-side conductive traces preserving said signal and ground interleaving to minimize trace-to-trace coupling between signal-carrying ones of said conductive traces.

30. The chip scale package of claim 23 wherein said substrate comprises a five-millimeter square chip carrier.

* * * * *